US010720512B2

(12) United States Patent
Liu

(10) Patent No.: US 10,720,512 B2
(45) Date of Patent: Jul. 21, 2020

(54) PRODUCT METHOD OF THIN-FILM TRANSISTOR, THIN-FILM TRANSISTOR, DISPLAY APPARATUS, AND FINGERPRINT RECOGNITION UNIT

(71) Applicant: BOE Technology Group Co., Ltd., Beijing (CN)

(72) Inventor: Yingwei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 275 days.

(21) Appl. No.: 15/793,299

(22) Filed: Oct. 25, 2017

(65) Prior Publication Data

US 2018/0277660 A1    Sep. 27, 2018

(30) Foreign Application Priority Data

Mar. 21, 2017    (CN) .......................... 2017 1 0168073

(51) Int. Cl.
*H01L 29/66* (2006.01)
*H01L 29/786* (2006.01)
*G06K 9/00* (2006.01)
*H01L 27/12* (2006.01)
*H01L 29/49* (2006.01)

(52) U.S. Cl.
CPC .... *H01L 29/66742* (2013.01); *G06K 9/00013* (2013.01); *G06K 9/00053* (2013.01);
(Continued)

(58) Field of Classification Search
CPC ............ G06K 9/00013; G06K 9/00053; H01L 27/1225; H01L 27/124; H01L 27/4908;
(Continued)

(56) References Cited

U.S. PATENT DOCUMENTS 9,190,438 B2    11/2015   Li et al.
2003/0178629 A1*    9/2003   Yagi ....................... H01L 33/26
257/87

(Continued)

FOREIGN PATENT DOCUMENTS

| CN | 101097335 A | 1/2008 |
| CN | 101694852 A | 4/2010 |
| CN | 102790069 A | 11/2012 |
| CN | 104037179 A | 9/2014 |

OTHER PUBLICATIONS

Second Office Action, including Search Report, for Chinese Patent Application No. 201710168073.5, dated Sep. 24, 2019, 13 pages.

*Primary Examiner* — Kim Y Vu
*Assistant Examiner* — Michael J Vanchy, Jr.
(74) *Attorney, Agent, or Firm* — Westman, Champlin & Koehler, P.A.

(57) ABSTRACT

This disclosure discloses a production method of a thin-film transistor, a thin-film transistor, a display apparatus, and a fingerprint recognition unit. Said method comprises the steps of: sequentially depositing a metal layer and an indium zinc oxide layer as a protective layer on a substrate; etching the metal layer and the indium zinc oxide layer to form a first electrode and a second electrode of a photosensitive device; and forming a photoelectric semiconductor of the photosensitive device on the first electrode.

10 Claims, 8 Drawing Sheets

(52) U.S. Cl.
CPC ........ *H01L 27/124* (2013.01); *H01L 27/1225* (2013.01); *H01L 29/4908* (2013.01); *H01L 29/66969* (2013.01); *H01L 29/7869* (2013.01); *H01L 29/78606* (2013.01); *H01L 29/78633* (2013.01)

(58) Field of Classification Search
CPC ......... H01L 29/66742; H01L 29/66969; H01L 29/78606; H01L 29/78633; H01L 29/7869
See application file for complete search history.

(56) References Cited

U.S. PATENT DOCUMENTS

| | | | |
|---|---|---|---|
| 2005/0213173 A1* | 9/2005 | Sasaki | G06K 9/0004 358/514 |
| 2010/0044717 A1* | 2/2010 | Choi | H01L 29/458 257/72 |
| 2010/0127253 A1* | 5/2010 | Inoue | G02F 1/136286 257/43 |
| 2013/0302939 A1* | 11/2013 | Liu | H01L 29/66969 438/104 |
| 2015/0014751 A1* | 1/2015 | Li | H01L 27/14632 257/229 |
| 2015/0295006 A1 | 10/2015 | Chen et al. | |
| 2016/0087021 A1* | 3/2016 | Sato | H01L 27/3262 257/43 |

* cited by examiner

PRODUCT METHOD OF THIN-FILM TRANSISTOR, THIN-FILM TRANSISTOR, DISPLAY APPARATUS, AND FINGERPRINT RECOGNITION UNIT

CROSS-REFERENCE TO RELATED APPLICATION

This application claims priority benefits of Chinese Application No. 201710168073.5 filed on Mar. 21, 2017, the entire contents of which are hereby incorporated by reference.

FIELD OF THE INVENTION

This disclosure relates to the technical field of thin-film transistors, and particularly refers to a production method of a thin-film transistor, a thin-film transistor, a display apparatus, and a fingerprint recognition unit.

BACKGROUND OF THE INVENTION

With the rapid development of display techniques, the display panels having the function of fingerprint recognition have been gradually popularized. At present, for contributing to lightening and thinning of the display panels, a fingerprint recognition unit comprising a thin-film transistor is typically used in the display panels.

An existing fingerprint recognition unit typically comprises a photosensitive device having photoelectric conversion properties. The photosensitive device is mainly composed of a semiconductor having the function of photoelectric conversion (simply referred to as a photoelectric semiconductor), for example a PIN or PN type semiconductor, or a Schottky type semiconductor. At present, in the process of producing a thin-film transistor comprising a photoelectric semiconductor, the photoelectric semiconductor needs to be etched in a patterning process after a layer of a photoelectric semiconductor thin-film is deposited. In the etching process for the photoelectric semiconductor, since the photoelectric semiconductor thin-film is relatively thick and a relatively large amount of overetching will be added, it will easily result in the damage to the electrode metal under the photoelectric semiconductor and the problem electrode overetching occurs. After the electrode metal is damaged, the electrical connection properties of the electrode will be deteriorated, and there may be cases such as broken circuit, bad conduction, and the like, leading to unreliable product quality and reduction of product qualification rate.

SUMMARY OF THE INVENTION

In view of this, this disclosure provides a display apparatus, a fingerprint recognition unit, and a thin-film transistor, as well as a production method thereof.

This disclosure provides a production method of a thin-film transistor, comprising the steps of:
sequentially depositing a metal layer and an indium zinc oxide layer as a protective layer on a substrate;
etching the metal layer and the indium zinc oxide layer to form a first electrode and a second electrode of a photosensitive device; and
forming a photoelectric semiconductor of the photosensitive device on the first electrode.

Further, the indium zinc oxide layer has a thickness in a range of 500 to 1000 Å.

Further, the indium zinc oxide layer comprises 20-90 wt % of $In_2O_3$ and 10-80 wt % of ZnO, based on the total weight of the indium zinc oxide layer.

Further, after said forming a photoelectric semiconductor of the photosensitive device, the method further comprises a step of removing the indium zinc oxide layer, which is not covered, by using a wet etching method.

Further, after said etching the metal layer and the indium zinc oxide layer, the method further comprises a step of forming a gate electrode of a switch device on the substrate; and
after said forming a photoelectric semiconductor of the photosensitive device, the method further comprises the steps of:
depositing an insulating layer covering the gate electrode, the first electrode, the second electrode, and the photoelectric semiconductor;
forming a semiconductor channel of the switch device, which is situated above the gate electrode and covers the insulating layer; and
after a patterning process for the insulating layer, forming a source electrode and a drain electrode of the switch device which are connected to two ends of the semiconductor channel, wherein the drain electrode is electrically connected to the first electrode.

Further, before said depositing an insulating layer covering the gate electrode, the first electrode, the second electrode, and the photoelectric semiconductor, the method further comprises a step of forming a layer of an ITO film covering the photoelectric semiconductor.

Further, after said forming a source electrode and a drain electrode of the switch device which are connected to two ends of the semiconductor channel, the method further comprises the steps of:
depositing a first transparent dielectric layer covering the source electrode, the drain electrode, and a metal connector; and
after a patterning process for the first transparent dielectric layer, forming an ITO film connecting the photoelectric semiconductor and the second electrode.

Further, after forming an ITO film connecting the photoelectric semiconductor and the second electrode, the method further comprises the steps of:
depositing a transparent resin layer covering the first transparent dielectric layer and the ITO film;
forming a light shielding layer which is situated above the semiconductor channel and covers the transparent resin layer; and
depositing a second transparent dielectric layer on the light shielding layer and the transparent resin layer.

This disclosure further provides a thin-film transistor, comprising:
a substrate;
a first electrode and a second electrode of a photosensitive device located on the substrate, wherein the first electrode comprises an indium zinc oxide layer and a metal layer covered by the indium zinc oxide layer; and
a photoelectric semiconductor of the photosensitive device covering the indium zinc oxide layer of the first electrode.

Further, the indium zinc oxide layer has a thickness in a range of 500 to 1000 Å.

Further, the indium zinc oxide layer comprises 20-90 wt % of $In_2O_3$ and 10-80 wt % of ZnO, based on the total weight of the indium zinc oxide layer.

Further, the thin-film transistor further comprises an ITO film electrically connecting the photoelectric semiconductor and the second electrode.

Further, the thin-film transistor further comprises a switch device including a gate electrode, a source electrode, a drain electrode, and a semiconductor channel, wherein the gate electrode is located on the substrate and is insulated from the source electrode, the drain electrode, and the semiconductor channel; the semiconductor channel is connected to the source electrode and the drain electrode; and the drain electrode is electrically connected to the first electrode.

Further, the thin-film transistor further comprises an insulating layer located on the substrate, wherein: the insulating layer covers the gate electrode, the photoelectric semiconductor, the first electrode, and the second electrode, and the periphery of the ITO film connecting the photoelectric semiconductor and the second electrode; and the source electrode, the drain electrode, and the semiconductor channel are located on the insulating layer.

Further, the thin-film transistor further comprises:

a first transparent dielectric layer covering the source electrode and the drain electrode;

a resin layer covering the first transparent dielectric layer;

a light shielding layer which covers the resin layer and is located above the semiconductor channel; and a second transparent dielectric layer covering the light shielding layer, wherein the first transparent dielectric layer and the resin layer cover the periphery of the ITO film.

This disclosure further provides a fingerprint recognition unit comprising the thin-film transistor described above.

This disclosure further provides a display apparatus having a function of fingerprint recognition, comprising the thin-film transistor described above.

DETAILED DESCRIPTION OF THE INVENTION

In order to enable objects, technical solutions, and advantages of this disclosure to be more obvious and clear, this disclosure will be further illustrated in details in conjunction with specific embodiments and with reference to figures.

Embodiments of this disclosure are described in detail below, instances of the embodiments are shown in the accompanying drawings, wherein the same or similar numerals represent the same or similar elements or elements having the same or similar functions throughout. The embodiments described below with reference to the accompanying drawings are exemplary and are merely used for explaining this disclosure, and it cannot be construed to be limitations of this disclosure.

It can be understood by the skilled person in this technical field that singular forms "a", "an", "the", and "this" used herein may also include plural forms, unless specifically stated. The phrase "and/or" used herein includes all, any, or all combinations of one or more of the associated listed items.

It is to be indicated that all expressions of "first" and "second" used in embodiments of this disclosure are intended to distinguish two different entities or different parameters having the same name. As can be seen, "first" and "second" are merely for the purpose of the convenience of expression, and should not be construed as limitations of embodiments of this disclosure, and descriptions for this are omitted in subsequent embodiments.

Figure 1:
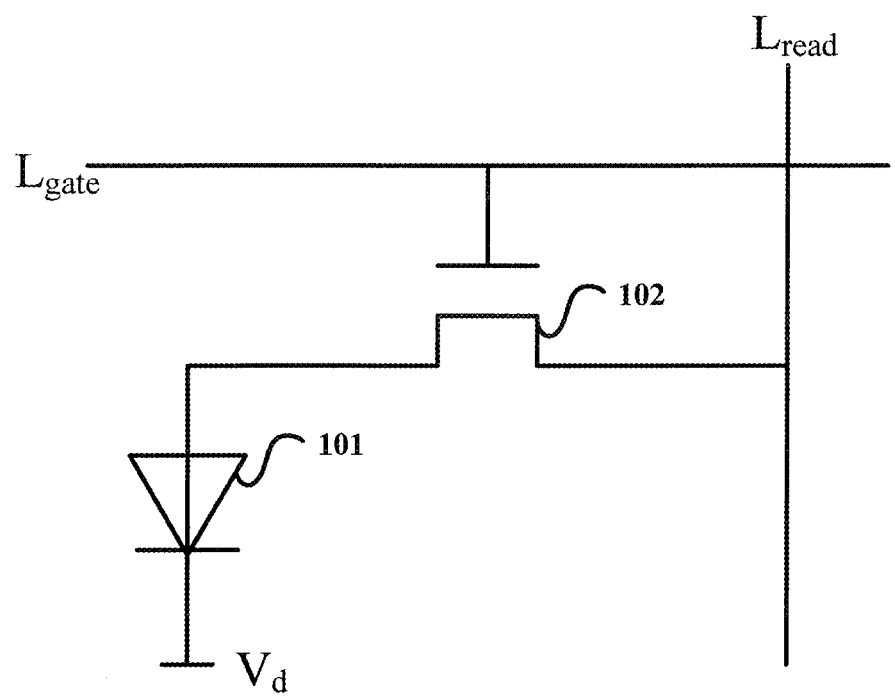
FIG. 1 is a schematic principle diagram of the structure of a fingerprint recognition unit.

As shown in FIG. 1, a fingerprint recognition unit typically comprises a photosensitive device 101 having photoelectric conversion properties and a switch device 102. A first electrode (or referred to as a negative electrode) of the photosensitive device 101 is electrically connected to a drain electrode of the switch device 102, and a second electrode (or referred to as a positive electrode) of the photosensitive device 101 is electrically connected to a data line of a reference voltage ($V_d$). The source electrode of the switch device 102 is connected to a data reading signal line ($L_{read}$), and a gate electrode of the switch device 102 is connected to a control signal line ($L_{gate}$).

When used in fingerprint recognition, a control signal may be provided to the gate electrode of the switch device 102 by the control signal line to control the conduction or shutdown between the source electrode and the drain electrode of the switch device 102. In the case where the source electrode and the drain electrode are conducted, photocurrent is generated after the photosensitive device 101 receives reflected light, and the photocurrent may pass through the source electrode and the drain electrode of the switch device 102 and is read by the data reading signal line.

Since the reflected light beams of fingerprint furrows and fingerprint ridges of a finger are different, it results in that light beam intensities received by the photosensitive device of the fingerprint recognition unit below fingerprint furrows and fingerprint ridges are different, and therefore the magnitudes of currents output are different. By recognizing various currents output by the fingerprint recognition unit, images of fingerprint lines of a hand may be obtained.

However, the photosensitive device is mainly composed of a semiconductor having the function of photoelectric conversion (simply referred to as a photoelectric semiconductor), for example a PIN or PN type semiconductor, or a Schottky type semiconductor. At present, in the process of producing a thin-film transistor comprising a photoelectric semiconductor, the photoelectric semiconductor needs to be etched in a patterning process after a layer of a photoelectric semiconductor thin-film is deposited. In the etching process for the photoelectric semiconductor, since the photoelectric semiconductor thin-film is relatively thick and a relatively large amount of overetching will be added, it will easily result in the damage to the electrode metal under the photoelectric semiconductor and the problem electrode overetching occurs. After the electrode metal is damaged, the electrical connection properties of the electrode will be deteriorated, and there may be cases such as broken circuit, bad conduction, and the like, leading to unreliable product quality and reduction of product qualification rate.

It has been contemplated by the inventor of this disclosure that a protective layer may be further deposited on the metal layer of the electrode in the process of producing the thin-film transistor having photoelectric conversion properties, so that the metal of the electrode is protected by the protective layer from being damaged due to etching in the etching of the photoelectric semiconductor. Further, this protective layer is removed in a subsequent process.

It is demonstrated by experiments that an indium zinc oxide layer may be used as the material of the protective layer. On the one hand, the dry etching is typically used in the etching of the photoelectric semiconductor, and the indium zinc oxide layer is rarely etched by the dry etching, so that the object of protecting the electrode metal covered thereby is achieved. On the other hand, the process of depositing the photoelectric semiconductor thin-film needs to be performed under an environment of high temperature, indium zinc oxide will not crystallize under an environment of high temperature compared to other oxides, such as ITO, which is favorable to the removal of the redundant protective layer in a subsequent process and the reduction of the impedance of the thin-film transistor.

Technical solutions of embodiments of this disclosure are illustrated in detail below in conjunction with accompanying drawings.

Figure 2A:
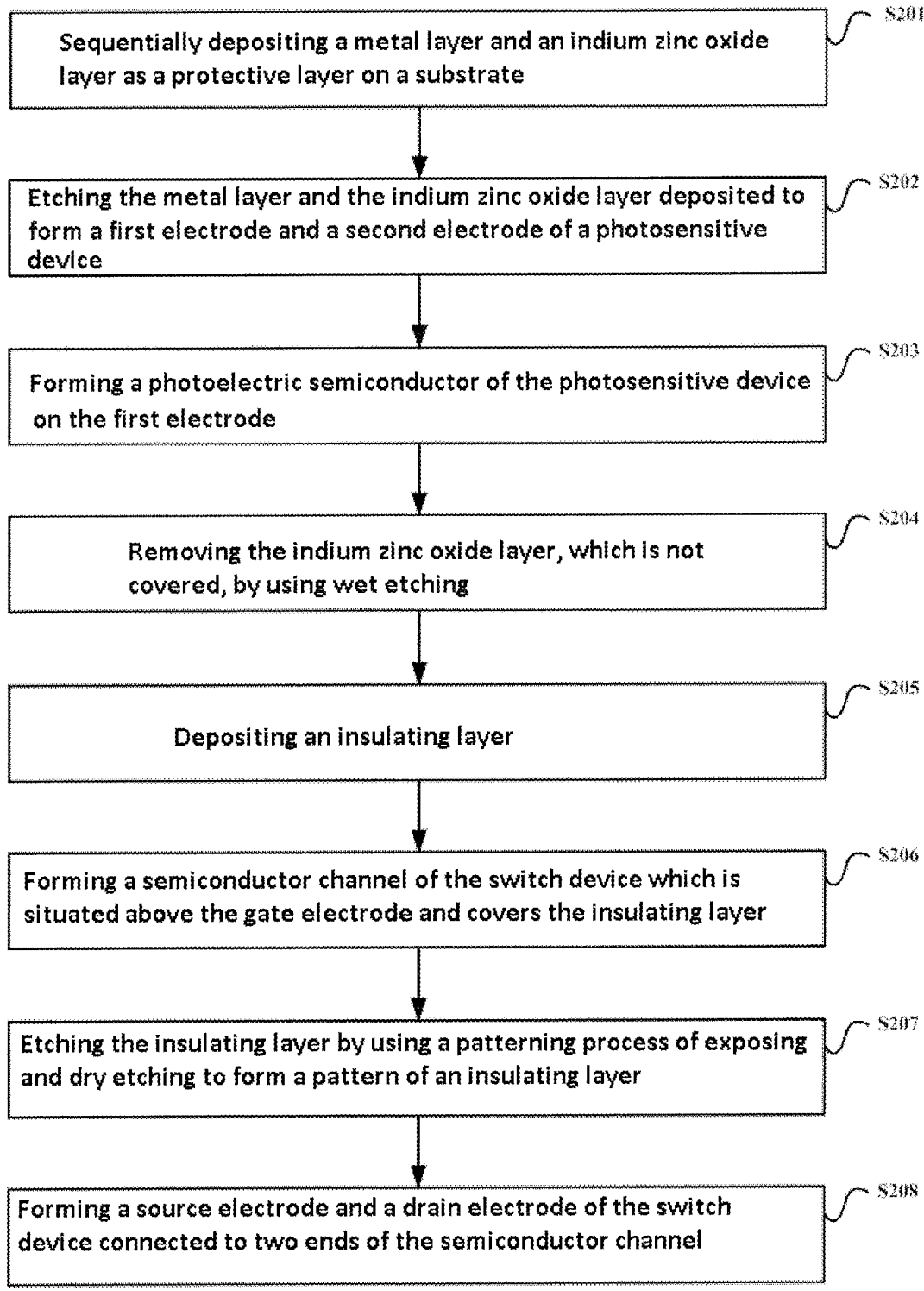
FIGS. 2a and 2b are flow charts of production methods of the thin-film transistors having photoelectric conversion properties, in embodiments of this disclosure.
Figure 2B:
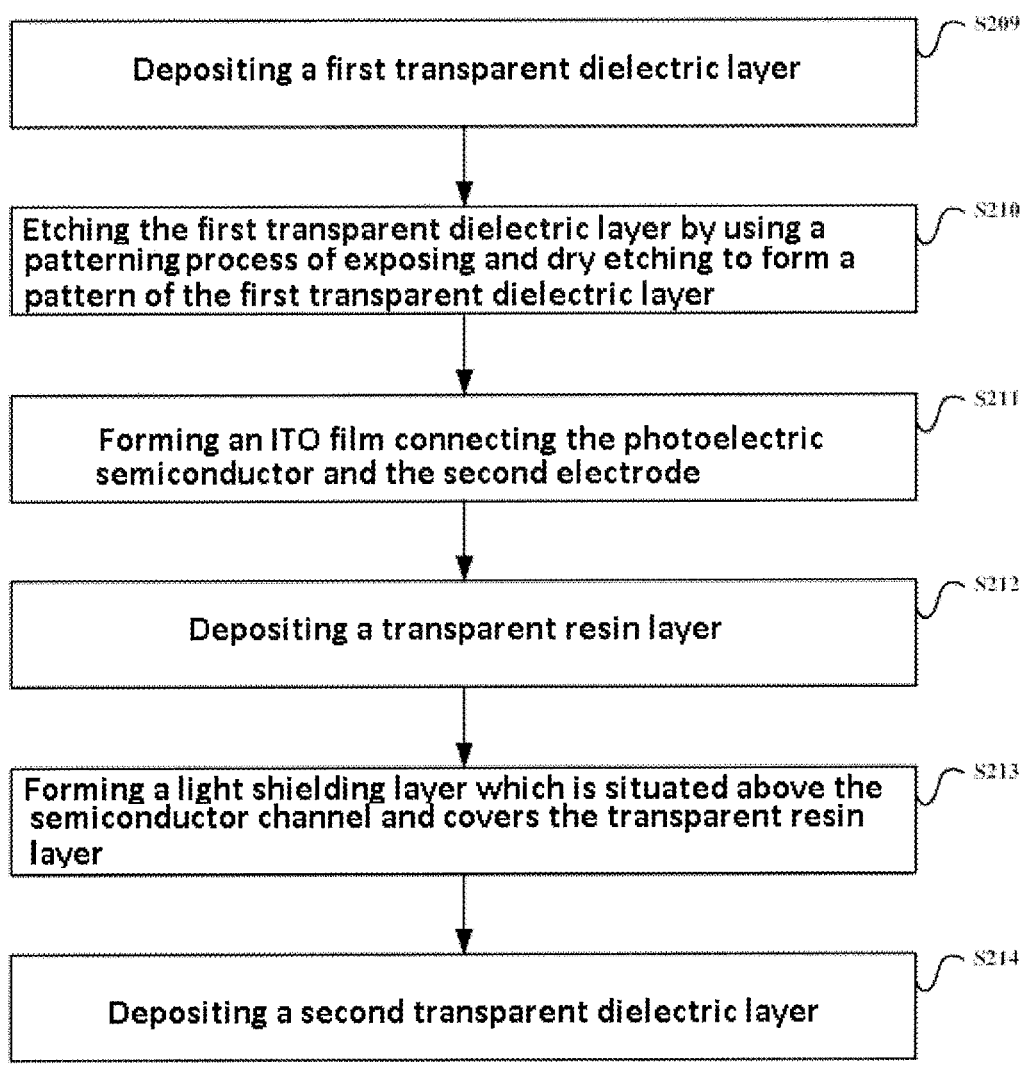

The production method of a thin-film transistor having photoelectric conversion properties provided by an embodiment of this disclosure, of which the process flow is as shown in FIG. 2a or 2b, comprises the steps of:

Step S201: sequentially depositing a metal layer and an indium zinc oxide layer as a protective layer on a substrate.

Figure 3A:
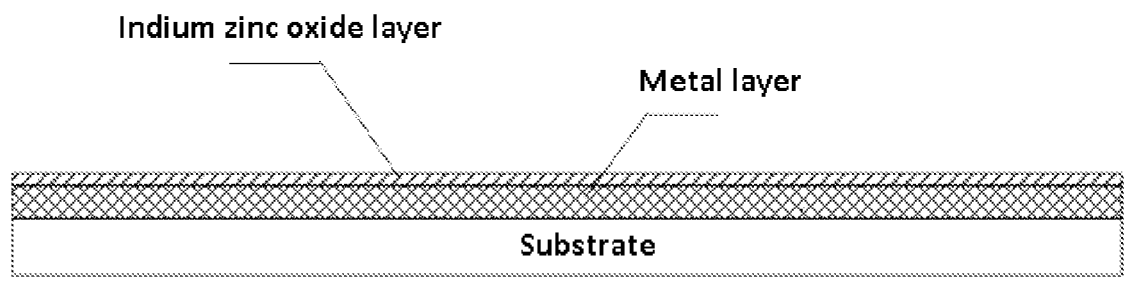
FIG. 3a is a structural schematic diagram of depositing a metal layer and an indium zinc oxide layer on a substrate, in an embodiment of this disclosure.

In this step, a metal layer is firstly deposited on a substrate, an indium zinc oxide layer as a protective layer is further deposited on the metal layer, and the structure formed is shown in FIG. 3a.

Particularly, the substrate may be a glass substrate, or may be a flexible material substrate. The indium zinc oxide layer has a thickness in a range of 500 to 1000 Å, and the indium zinc oxide layer comprises 20-90 wt % of $In_2O_3$ and 10-80 wt % of ZnO, based on the total weight of the indium zinc oxide layer. Furthermore, the indium zinc oxide layer may be composed of 20% to 90% of $In_2O_3$ and 80% to 11% of ZnO.

Step S202: etching the metal layer and the indium zinc oxide layer deposited to form a first electrode and a second electrode of a photosensitive device.

Figure 3B:
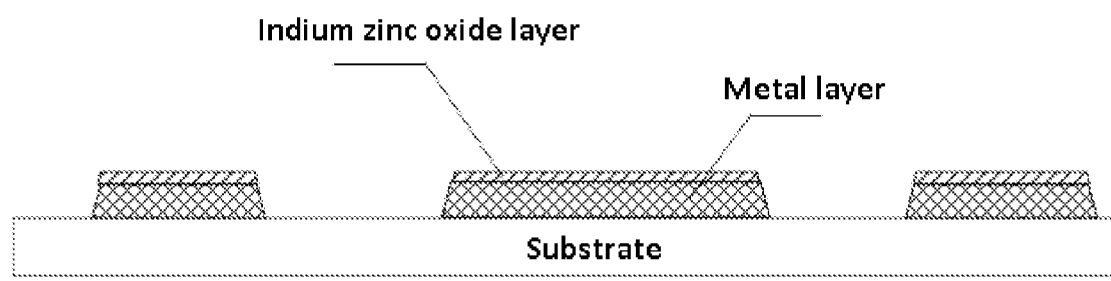
FIG. 3b is a schematic diagram of a structure formed after etching a metal layer and an indium zinc oxide layer deposited, in an embodiment of this disclosure.

In the patterning process of this step, the metal layer and the indium zinc oxide layer deposited in the previous step are etched to form a first electrode and a second electrode of a photosensitive device, and the structure formed is shown in FIG. 3b. Here, the first electrode may be the negative electrode of the photosensitive device; and the second electrode may be the positive electrode of the photosensitive device, i.e., an electrode electrically connected to a data line of a reference voltage ($V_d$).

Furthermore, the thin-film transistor having photoelectric conversion properties of the embodiment of this disclosure may further comprise a switch device. In the patterning process of this step, when the first electrode and the second electrode of the photosensitive device are formed, the gate electrode of the switch device may also be formed. That is, the gate electrode of the switch device may be formed in addition to the first electrode and the second electrode of the photosensitive device after etching the metal layer and the indium zinc oxide layer.

Step S203: forming a photoelectric semiconductor of the photosensitive device on the first electrode.

Based on the structure formed in the step described above, a photoelectric semiconductor thin-film is deposited in this step. After the photoelectric semiconductor is deposited, the photoelectric semiconductor thin-film is etched in the patterning process of this step to form a photoelectric semiconductor covering the first electrode. Preferably, in order to protect the photoelectric semiconductor thin-film formed from being damaged in the operation of etching in a subsequent step, a layer of an ITO (indium tin oxide) film may be additionally deposited on the deposited photoelectric semiconductor thin-film before the photoelectric semiconductor thin-film is etched in this step so as to protect the photoelectric semiconductor. Thereafter, a pattern of a first ITO film 410 is formed by using a wet etching method, and a pattern of the photoelectric semiconductor is formed by a dry etching method. Since the first ITO film 410 has both conductivity and optical transparency, light incident onto the photoelectric semiconductor will not be shielded and a conduction pathway may also be provided to photocurrent while the photoelectric semiconductor is protected by this layer of first ITO film 410.

Since the electrode, on which the indium zinc oxide layer as a protective layer overlies, is not affected by dry etching of the photoelectric semiconductor thin-film, the electrode metal may be prevented from being damaged and the protection effect is achieved in the process of etching the photoelectric semiconductor thin-film of this step.

Figure 4A:
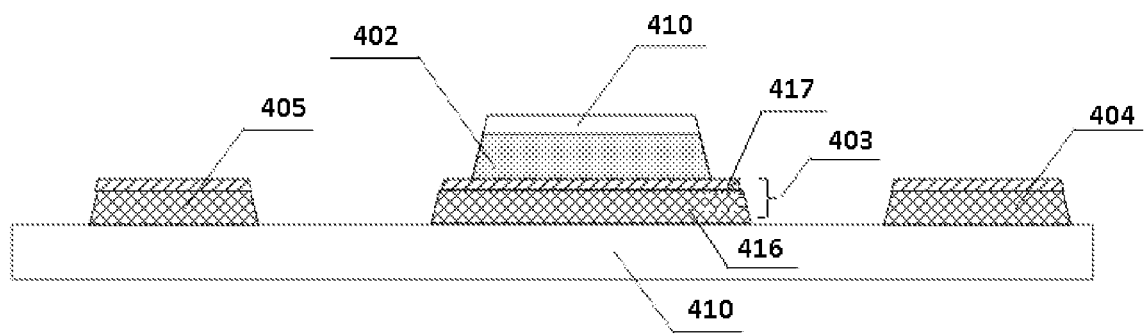
FIG. 4a is a structural schematic diagram of a thin-film transistor having photoelectric conversion properties which has been subjected to a photoelectric semiconductor etching process, in an embodiment of this disclosure.

FIG. 4a shows a structural schematic diagram of a thin-film transistor having photoelectric conversion properties after being subjected to a photoelectric semiconductor etching process, in an embodiment of this disclosure, which comprises: a substrate 401, a photoelectric semiconductor 402 of the photosensitive device, a first electrode 403 of the photosensitive device located on the substrate, and a second electrode 404 of the photosensitive device; wherein the first electrode 403 comprises an indium zinc oxide layer 417 and a metal layer 416 covered by the indium zinc oxide layer 417; and the photoelectric semiconductor 402 covers the indium zinc oxide layer 417 of the first electrode 403. Furthermore, the thin-film transistor having photoelectric conversion properties of the embodiment of this disclosure may further comprise a switch device. Therefore, as shown in FIG. 4a, the structure of the thin-film transistor may further comprise: a gate electrode 405 of the switch device.

Step S204: removing the indium zinc oxide layer 417, which is not covered, by using wet etching.

As a preferable embodiment, by removing the indium zinc oxide layer 417, which is not covered by the photoelectric semiconductor, by using a wet etching method in this step, for example removing the indium zinc oxide layer 417 on the second electrode 404 of the photosensitive device and the gate electrode 405 of the switch device, which may reduce the impedance of the entire thin-film transistor.

Figure 4B:
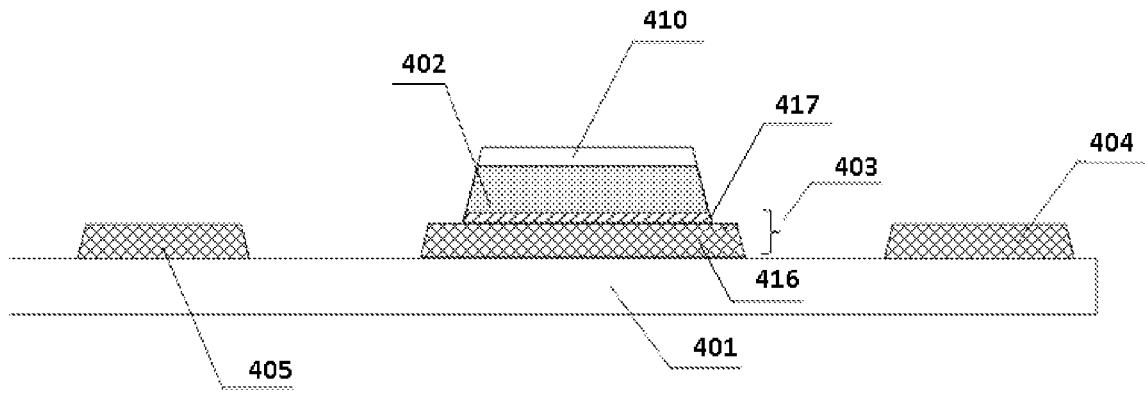
FIG. 4b is a structural schematic diagram of a thin-film transistor having photoelectric conversion properties wherein the redundant indium zinc oxide layer has been removed, in an embodiment of this disclosure.

In the structural schematic diagram of the thin-film transistor as shown in FIG. 4b, the indium zinc oxide layer 417 on the second electrode 404 and the gate electrode 405 of the switch device has been removed.

Of course, after step S203 described above is carried out, step S205 of depositing an insulating layer described below may be carried out directly without carrying out this step.

In this way, the indium zinc oxide layer 417 will remain on the metal of respective electrodes and certain impedance will exist in the process of conduction.

Step S205: depositing an insulating layer.

Figure 5:
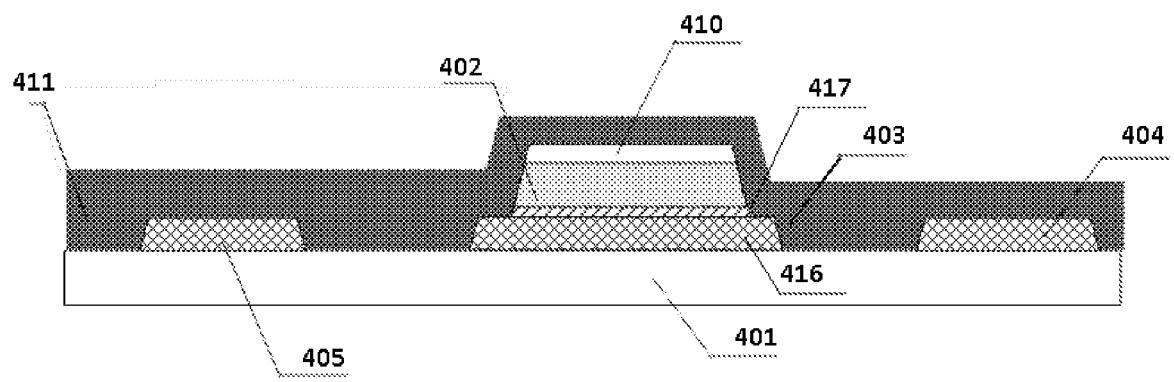
FIG. 5 is a structural schematic diagram of a thin-film transistor having photoelectric conversion properties with a deposited insulating layer, in an embodiment of this disclosure.

Base on the structure formed in the step described above, an insulating layer 411 is deposited in this step, and the structure is shown in FIG. 5, in which an insulating layer 411 covering the gate electrode, the first electrode, the second electrode, and the photoelectric semiconductor is formed to insulate and fix various electrodes.

Step S206: forming a semiconductor channel of the switch device, which is situated above the gate electrode and covers the insulating layer.

Figure 6:
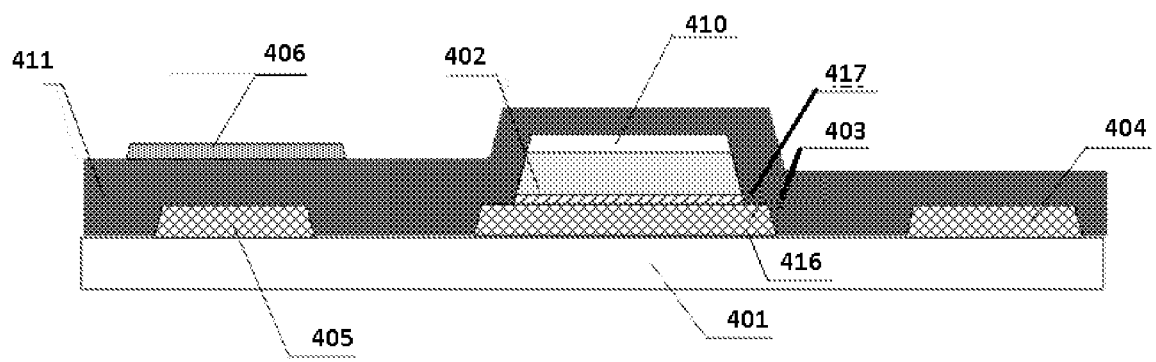
FIG. 6 is a structural schematic diagram of a thin-film transistor with a semiconductor channel formed, in an embodiment of this disclosure.

Based on the structure formed in the step described above, an IGZO (indium gallium zinc oxide) thin-film is deposited in this step. Thereafter, in the patterning process performed by an exposing and wet etching method, a semiconductor channel 406 of the switch device is formed, which is situated above the gate electrode 405 and covers the insulating layer, as shown in FIG. 6.

Figure 7:
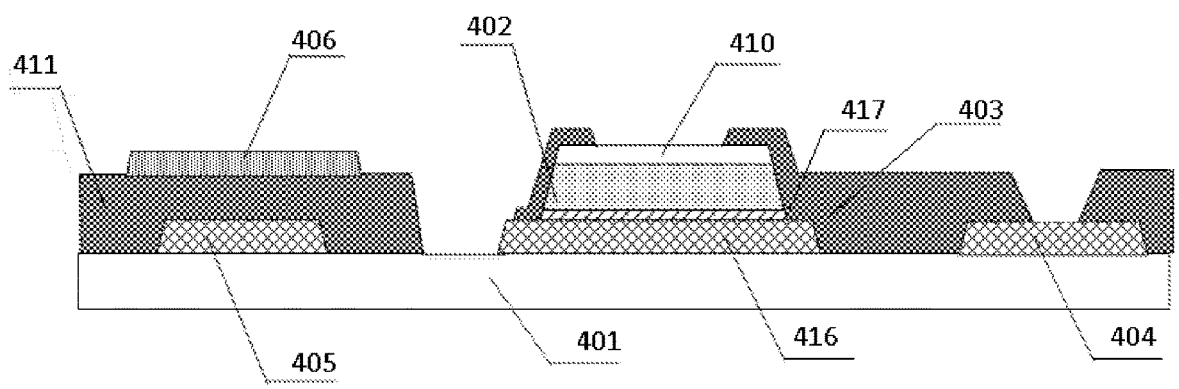
FIG. 7 is a structural schematic diagram of a thin-film transistor with an insulating layer formed, in an embodiment of this disclosure.

Step S207: etching the insulating layer by using a patterning process of exposing and dry etching to form a pattern of an insulating layer as shown in FIG. 7.

Step S208: forming a source electrode and a drain electrode of the switch device which are connected to two ends of the semiconductor channel.

After the patterning process for the insulating layer 411 in step S207 described above, a metal layer 416 is first deposited in this step. Thereafter, in the patterning process of this metal layer 416, a source electrode 407 and a drain electrode 408 of the switch device connected to two ends of the semiconductor channel are formed, and the drain electrode 408 is electrically connected to the first electrode 403 through the metal layer 416, as shown in FIG. 8.

Figure 8:
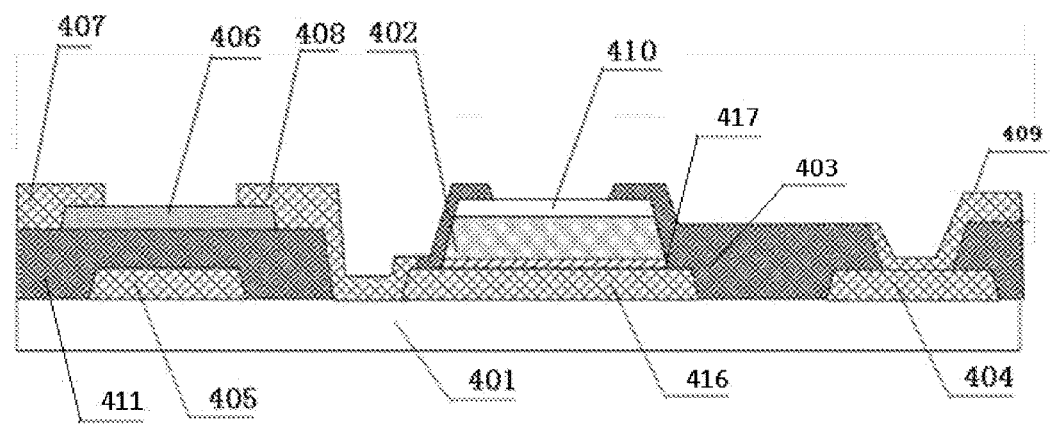
FIG. 8 is a structural schematic diagram of a thin-film transistor having photoelectric conversion properties and comprising a switch device, in an embodiment of this disclosure.

Furthermore, in the patterning process of the metal layer 416 of this step, a metal connector 409 may also be formed on the second electrode 404 so as to facilitate the electrical connection of the second electrode 404, as shown in FIG. 8.

Step S209: depositing a first transparent dielectric layer.

After the patterning process of the metal layer 416 of step S208 described above, a first transparent dielectric (PVX1) layer 412 covering the source electrode, the drain electrode, and the metal connector may be further deposited in this step. The first transparent dielectric (PVX1) layer 412 has optical transparency, and at the meanwhile, it may have effects of protection and insulation on metal substances thereunder, such as the source electrode, the drain electrode, and the like.

Figure 9:
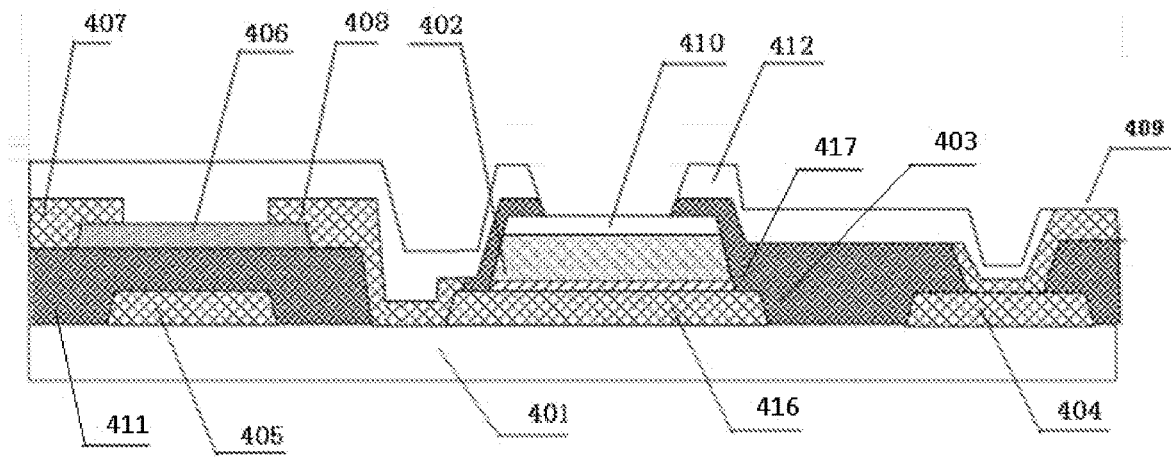
FIG. 9 is a structural schematic diagram of a thin-film transistor after the first transparent dielectric layer has been etched, in an embodiment of this disclosure.

Step S210: etching the first transparent dielectric layer by using a patterning process of exposing and dry etching to form a pattern of the first transparent dielectric layer as shown in FIG. 9.

Step S211: forming an second ITO film connecting the photoelectric semiconductor and the second electrode.

Figure 10:
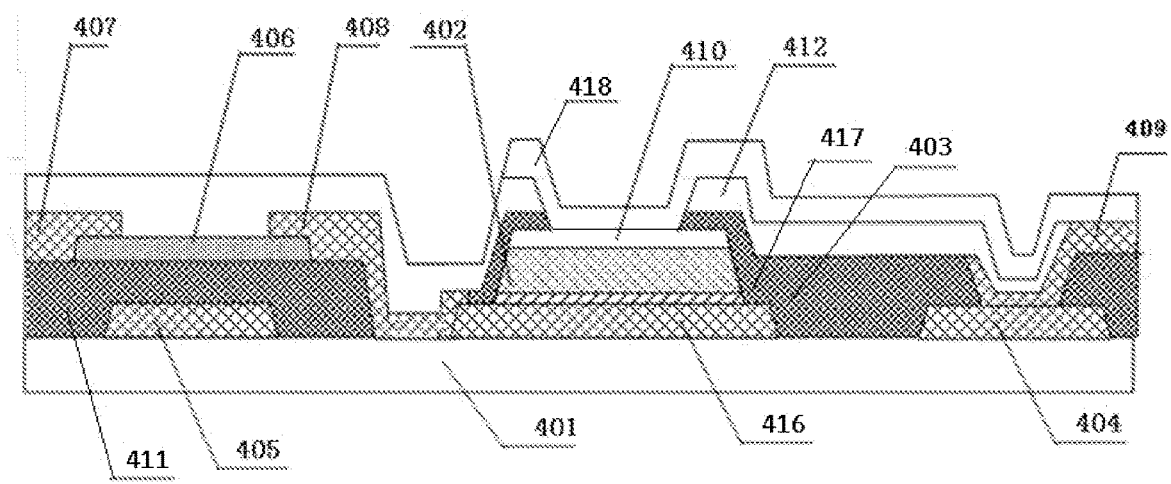
FIG. 10 is a structural schematic diagram of a thin-film transistor with an ITO film connecting a photoelectric semiconductor and a second electrode formed, in an embodiment of this disclosure.

After a patterning process for the first transparent dielectric layer of step S210 described above, a layer of an ITO film is firstly deposited in this step. Thereafter, in the patterning process of this ITO film layer, an second ITO film 418 electrically connecting the photoelectric semiconductor 402 and the second electrode 404 is formed, as shown in FIG. 10. This layer of second ITO film 418 is connected to the first ITO film 410 covering the photoelectric semiconductor 402 mentioned in step S203 described above, and at the meanwhile, this layer of scond ITO film 418 is also connected to the metal connector 409 on the second electrode 404 formed in the patterning process of the metal layer 416 of step S208 described above, so that the electrical connection between the photoelectric semiconductor 402 and the second electrode 404 is achieved, and this layer of second ITO film 418 will not shield light at the meanwhile.

Step S212: depositing a transparent resin layer.

After the patterning process of the ITO film layer of step S211 described above, further, a transparent resin layer 401 covering the first transparent dielectric layer and the second ITO film 418 is deposited in this step to insulate and protect the ITO film.

Step S213: forming a light shielding layer which is situated above the semiconductor channel and covers the transparent resin layer.

Figure 11:
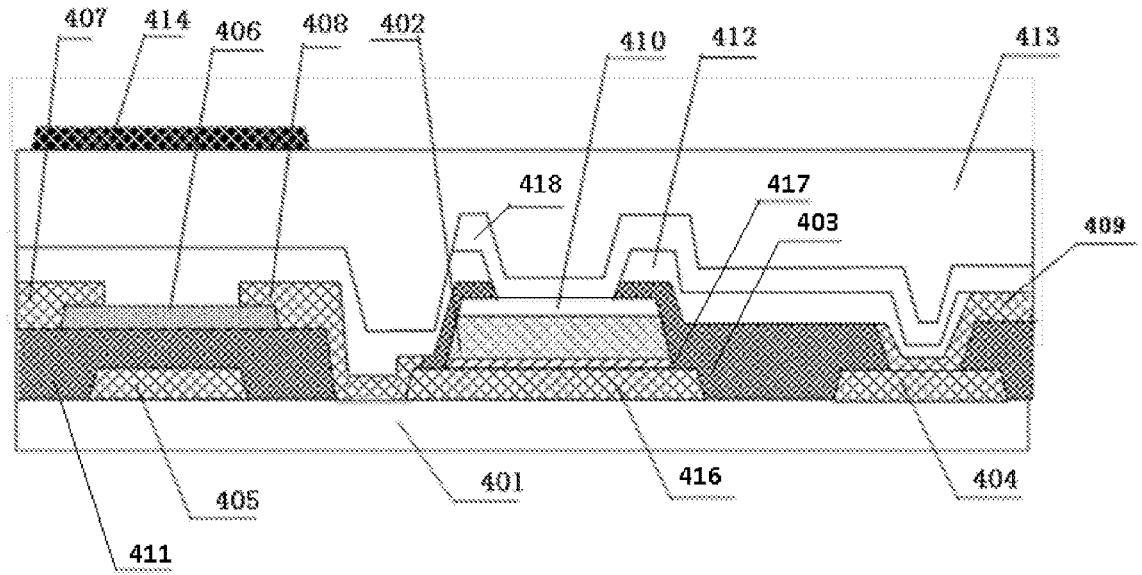
FIG. 11 is a structural schematic diagram of a thin-film transistor having a light shielding layer, in an embodiment of this disclosure.

In the case where the transparent resin has optical transparency, in order to ensure that semiconductive properties of the semiconductor channel of the switch device are not affected by light, therefore further in this step, a light shielding layer 414 covering the transparent resin layer 413 is firstly deposited. Thereafter, the light shielding layer 414 is etched, and only the light shielding layer 414 above the semiconductor channel remains, and the light shielding layer 414 above the photoelectric semiconductor is removed, as shown in FIG. 11.

Step S214: depositing a second transparent dielectric layer.

Figure 12:
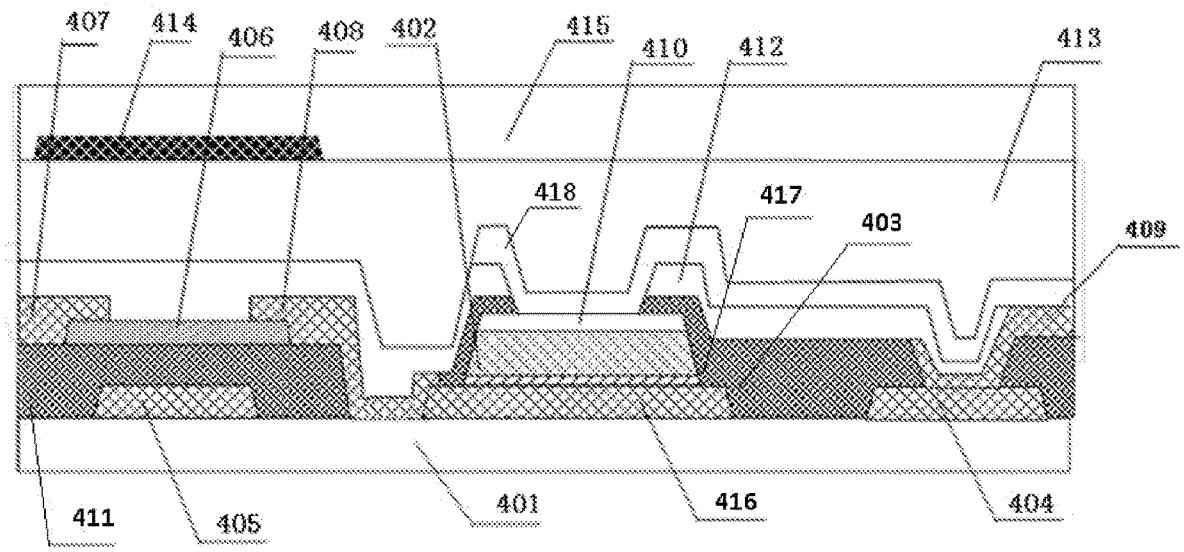
FIG. 12 is a structural schematic diagram of a thin-film transistor with a second transparent dielectric layer deposited, in an embodiment of this disclosure.

Further, In order to fix the light shielding layer 414 described above, a second transparent dielectric layer (PVX2) 415 may be further deposited on the light shielding layer 414 and the transparent resin layer 413 in this step, as shown in FIG. 12. The second transparent dielectric layer 415 also has the optical transparency and insulating property.

As can be seen from those described above, based on the production method described above, the thin-film transistor having photoelectric conversion properties of an embodiment of this disclosure may comprise: a first electrode 403 and a second electrode 404 of the photosensitive device located on the substrate 401, and a photoelectric semiconductor 402 of the photosensitive device; wherein the first electrode 403 comprises an indium zinc oxide layer 417 and a metal layer 416 covered by the indium zinc oxide layer 417; the photoelectric semiconductor 402 of the photosensitive device covers the indium zinc oxide layer 417 of the first electrode. Furthermore, the thin-film transistor having photoelectric conversion properties of an embodiment of this disclosure may further comprise an second ITO film 418 electrically connecting the photoelectric semiconductor 402 and the second electrode 404.

Further, the thin-film transistor having photoelectric conversion properties of an embodiment of this disclosure may further comprise a switch device. Here, the switch device comprises: a gate electrode 405, a source electrode 407, a drain electrode 408, and a semiconductor channel 406.

Here, the gate electrode 405 is located on the substrate 401 and is insulated from the source electrode 407, the drain electrode 408, and the semiconductor channel 406. The semiconductor channel 406 is connected between the source electrode 407 and the drain electrode 408.

The drain electrode 408 is electrically connected to the first electrode 403.

Further, the thin-film transistor having photoelectric conversion properties of an embodiment of this disclosure may further comprise an insulating layer 411 located on the substrate 401.

This insulating layer 411 covers the gate electrode, the photoelectric semiconductor, the first electrode, and the second electrode, and the periphery of the ITO film connecting the photoelectric semiconductor and the second electrode. The source electrode 407, the drain electrode 408, and the semiconductor channel 406 are located on the insulating layer 411.

Further, the thin-film transistor having photoelectric conversion properties of an embodiment of this disclosure may further comprise:

a first transparent dielectric layer covering the source electrode 407 and the drain electrode 408;

a resin layer covering the first transparent dielectric layer;

a light shielding layer 414 which covers the resin layer and is located above the semiconductor channel 406; and a second transparent dielectric layer covering the light shielding layer 414;

wherein the first transparent dielectric layer and the resin layer cover the periphery of the ITO film.

The fingerprint recognition unit provided by an embodiment of this disclosure may comprise the thin-film transistor having photoelectric conversion properties described above.

The display apparatus having the function of fingerprint recognition provided by an embodiment of this disclosure may comprise the fingerprint recognition unit described above. That is, it may comprise the thin-film transistor having photoelectric conversion properties described above.

In technical solutions of embodiments of this disclosure, a protective layer is further deposited on the metal layer of the electrode in the process of producing the thin-film transistor having photoelectric conversion properties, so that the metal of the electrode is protected by the protective layer from being damaged due to etching in the etching of the photoelectric semiconductor. An indium zinc oxide layer is used as the material of the protective layer. On the one hand, the dry etching is typically used in the etching of the photoelectric semiconductor, and the indium zinc oxide layer is rarely etched by the dry etching, so that the object of protecting the electrode metal covered thereby is achieved. On the other hand, the process of depositing the photoelectric semiconductor thin-film needs to be performed under an environment of high temperature, indium zinc oxide will not crystallize under an environment of high temperature compared to other oxides, such as ITO, which is favorable to the removal of the redundant protective layer in a subsequent process and the reduction of the impedance of the thin-film transistor.

In the process of producing the thin-film transistor of this disclosure, the damage of the electrode metal under the photoelectric semiconductor may be avoided so as to improve the quality and the qualification rate of the product.

It can be understood by the skilled person in this technical field that the steps, measures, schemes in various operations, methods, and process flows, which have been discussed in this disclosure, may be alternated, modified, combined, or deleted. Further, other steps, measures, schemes in various operations, methods, and process flows, which have been discussed in this disclosure, may also be alternated, modified, rearranged, decomposed, combined, or deleted. Further, the steps, measures, schemes in various operations, methods, and process flows, which have been disclosed in the prior art and in this disclosure, may also be alternated, modified, rearranged, decomposed, combined, or deleted.

It is to be understood by one of ordinary skill in the art that the discussion of any above embodiment is merely exemplary and is not intended to imply that the scope (including claims) of this disclosure is limited to these examples; and under the idea of this disclosure, in an embodiment or different embodiments, the technical features may be combined with others, the steps may be implemented in any order, and there are a plurality of other changes in different aspects of this disclosure as described above. For the purpose of simplicity, those are not provided in detail. Therefore, all of the omissions, modifications, equivalent replacements, improvements, and the like, which are within the spirit and the principle of this disclosure, should be encompassed in the scope protected by this disclosure.

What is claimed is:

1. A fingerprint recognition unit, comprising:
   a substrate;
   a photosensitive device, comprising:
   a first electrode on the substrate;
   a second electrode on the substrate; and
   a photoelectric semiconductor on a side of the first electrode away from the substrate,
   wherein the first electrode comprises a metal layer deposited on the substrate and an indium zinc oxide layer covering the metal layer, an orthographic projection of the first electrode on the substrate does not overlap an orthographic projection of the second electrode on the substrate, and an orthographic projection of the indium zinc oxide layer on the substrate is within a range of an orthographic projection of the metal layer on the substrate;
   a switch device, comprising:
   a gate electrode on the substrate;
   a semiconductor channel situated above the gate electrode; and
   a source electrode and a drain electrode separately connected to one of two ends of the semiconductor channel;
   wherein the second electrode is situated on a side of the first electrode away from the switch device, an orthographic projection of the photosensitive device on the substrate does not overlap an orthographic projection of the switch device on the substrate, the drain electrode is electrically connected to the first electrode, and the first electrode is electrically connected to the second electrode.

2. The fingerprint recognition unit according to claim 1, wherein the indium zinc oxide layer has a thickness in a range of 500 to 1000 Å.

3. The fingerprint recognition unit according to claim 1, wherein the indium zinc oxide layer comprises 20-90 wt % of $In_2O_3$ and 10-80 wt % of ZnO, based on the total weight of the indium zinc oxide layer.

4. The fingerprint recognition unit according to claim 1, further comprising a first ITO film on the photoelectric semiconductor.

5. The fingerprint recognition unit according to claim 4, further comprising an insulating layer covering the gate electrode, the photoelectric semiconductor, the first electrode, the second electrode, and the periphery of the first ITO film, and the source electrode, the drain electrode and the semiconductor channel are above the insulating layer.

6. The fingerprint recognition unit according to claim 5, further comprising:
 a first transparent dielectric layer covering the source electrode, the drain electrode and the insulating layer;
 a resin layer covering the first transparent dielectric layer;
 a light shielding layer which covers the resin layer and is located above the semiconductor channel; and
 a second transparent dielectric layer covering the light shielding layer.

7. The fingerprint recognition unit according to claim 6, wherein there is a via hole above the first ITO film that penetrates the insulating layer and the first transparent dielectric layer, the first ITO film is connected to a second ITO film above the first transparent dielectric layer through the via hole, and the second ITO film is electrically connected to the second electrode.

8. The fingerprint recognition unit according to claim 6, wherein an orthographic projection of the semiconductor channel on the substrate and an orthographic projection of the gate electrode on the substrate are within a range of an orthographic projection of the light shielding layer on the substrate.

9. The fingerprint recognition unit according to claim 1, wherein there is no indium zinc oxide layer above the second electrode.

10. A display apparatus having a function of fingerprint recognition, comprising the fingerprint recognition unit as claimed in claim 1.

* * * * *